United States Patent [19]

Harada

[11] Patent Number: 5,111,082
[45] Date of Patent: May 5, 1992

[54] SUPERCONDUCTING THRESHOLD LOGIC CIRCUIT

[75] Inventor: Yutaka Harada, Nishitama, Japan

[73] Assignee: Research Development Corporation of Japan, Tokyo, Japan

[21] Appl. No.: 551,495

[22] Filed: Jul. 12, 1990

[30] Foreign Application Priority Data

Jul. 28, 1989 [JP] Japan .................. 1-196115

[51] Int. Cl.⁵ .......................................... H03K 17/92
[52] U.S. Cl. ................................. 307/476; 307/201;
307/306; 505/858; 505/865
[58] Field of Search ............... 307/306, 201, 462, 476;
505/859, 865, 858

[56] References Cited

U.S. PATENT DOCUMENTS

| | | | |
|---|---|---|---|
| 3,599,009 | 8/1971 | Parmentier et al. | 307/201 |
| 3,983,419 | 9/1976 | Fang | 307/306 |
| 4,117,354 | 9/1978 | Gheewala | 307/306 |
| 4,313,066 | 1/1982 | Gheewala | 307/462 |
| 4,342,924 | 8/1982 | Howard et al. | 307/476 |
| 4,506,166 | 3/1985 | Sone | 307/306 |
| 4,713,562 | 12/1987 | Hasuo et al. | 307/306 |

OTHER PUBLICATIONS

Windrow, Bernard and Lehr, Michael A. "30 Years of Adaptive Neural Networks: Perception, Madaline, and Backpropagation", Proceedings of the IEEE, vol. 78, No. 9, Sep. 1990.

"Artificial Neural Networks for Computing", by L. D. Jackel et al., Journal of Vacuum Sci. Tech., B4(1), Jan/-Feb. 1986, pp. 61-61.

"A 4-bit Multiplier and 3-bit Counter in Josephson Threshold Logic", by Y. Hatano et al., IEEE Jrnl. of Solid-State Circuits, vol. SC-22, No. 4, Aug. 1987.

"Josephson-Logic Device and Circuit", by T. R. Gheewala, IEEE Trans. Electron Devices, vol. ED-27, #10, pp. 1857-1869.

Primary Examiner—John Zazworsky
Attorney, Agent, or Firm—Fleit, Jacobson, Cohn, Price, Holman & Stern

[57] ABSTRACT

A superconducting threshold logic circuit comprises current switching circuits each having a Josephson device. Bias currents of the switching circuits are varied independently to change weights for input signals. A sum of the weighted input signals are inputted to another current switching circuit having a Josephson device in order to compare the sum with a threshold.

6 Claims, 7 Drawing Sheets

SUPERCONDUCTING THRESHOLD LOGIC CIRCUIT

BACKGROUND OF THE INVENTION

This invention relates circuits, especially to threshold logic circuits using superconducting devices which cause transition between a superconducting state and a voltage state.

FIELD OF THE INVENTION

The conventional computers are built up with logic circuits comprising AND or OR circuits. These computers operate in an extreme high speed which highly exceeds the human ability and then contribute to the social prosperity. However, the conventional computers do not conform to the recognizing and the judging processes of human beings. In order to establish novel computers adequate for the recognizing and the judging processes, threshold logic circuits and new computer systems using these circuits have been provided, by taking the human brain cells(neuron) as a good model, in the treatises for instance by L. D. Jackel, R. E. Howard, H. P. Graf, B. Straughn, and J. D. Denker in "Artificial neural networks for computing" Journal of Vacuum Science Technology B4(1), Jan/Feb. 1986, pp. 61-63. A general discussion about neural networks is given in "Bernard Widrow and Michael A. Lehr, "30 Years of Adaptive Neural Networks: Perceptron, Madaline, and Backpropagation", Proceedings of the IEEE, Vol. 78 No. 9, September 1990.

Hereinbelow, we will explain the threshold logic circuit for better understanding of this invention. FIG. 2 shows operation of the threshold circuit. The threshold logic circuit 1 has a plurality of input terminals 2, and at least one output terminal 3. In the threshold circuit 1, "0" or "1" digital signal Xi is applied to each input terminals 2. When a sum of weighted digital signals $\Sigma$ WiXi exceeds a threshold value, output is "1", otherwise "0" wherein Wi is a weight for a signal Xi. An important characteristic of the threshold logic circuits reside in the learning faculty. In other words, the weight Wi is changed by learning so as to sequentially establish a system adequate for a certain purpose. Therefore, it is required for the threshold logic circuits to have not only the faculty of switching states of circuit elements by a sum of weighted input signals, but also the faculty of changing the weights Wi. In prior arts, to this end, a threshold circuit is simulated on a computer by using software. In more detail, multiplying and summing operations to obtain a sum of weighted signals are carried out only by a software or by the help of a complicated hardware circuit including a dedicated multiplier. The prior art threshold logic circuits have disadvantages. The processing speed by means of software is very slow, and the circuit utilising the multiplier has many circuit elements and then the system becomes bigger. As it will be clear from the brain cells, when the computer is built up by the threshold logic circuits, the more the number of circuit elements, the more the number of the faculties and the higher is the accuracy. Each circuit does not always need to have high accuracy. On the contrary, the threshold logic circuits must have a simple structure which makes it possible to raise the scale of integration. In order to carry out the learning, the recognizing and the judging processes, the threshold logic circuits must be composed of high speed switching circuits.

The Josephson device has excellent capabilities as a computer element because it dissipates less power and operates in a high speed. Thus if a threshold logic circuit using the Josephson devices is employed, performance of the computer will be improved extremely. An example of the threshold circuit using Josephson devices is disclosed by Y. Hatano, Y. Harada, K. Yamashita, Y. Tarutani and U. Kawabe "A 4-bit×4-bit Multiplier and 3-bit Counter in Josephson Threshold Logic", IEEE Journal of Solid-State Circuits, Vol. SC-22, No. 4, August 1987. However, in the prior art threshold logic circuit, the weights shown in FIG. 2 are fixed and then the learning capability is not provided.

The above and other objects of this invention will be apparent from the following descriptions, taken in conjunction with the accompany drawings, in which like reference numerals denote identical or corresponding parts.

SUMMARY OF THE INVENTION

An object of this invention is to provide a threshold logic circuit by use of high-speed Josephson device, which can vary the weights arbitrarily and to provide a computer realizing good recognizing and judging capabilities through various high speed learning processes by use of the threshold logic circuits.

To attain this object, a superconducting threshold logic circuit according to this invention comprises current switching circuits each having a Josephson device. Bias currents of the switching circuits are varied independently to change weights for input signals. A sum of the weight input signals, that is, a sum of output currents from the current switching circuits are imputed to another current switching circuit having a Josephson device in order to compare the sum with a threshold.

DETAILED DESCRIPTION OF THE PREFERRED EMBODIMENT

Figure 3:
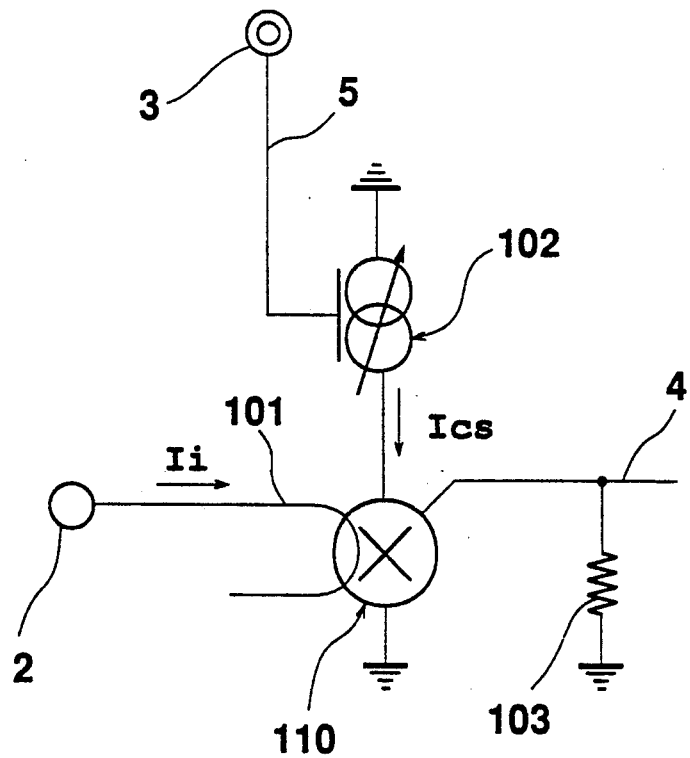
FIG. 3 is a circuit diagram of means for supplying bias current to a magnetic flux coupled-type Josephson device used in this invention.

We will explain examples of this invention. FIG. 3 shows means for supplying bias current to the Josephson device used in a superconducting threshold logic circuit according to this invention. In the example shown in FIG. 3, a magnetic flux coupled-type Josephson device 110 is supplied with bias current Ics by a variable current source. A load resistor 103 and an input line 101 are connected to the magnetic flux coupled-type Josephson device. The magnetic flux coupled-type superconducting device 110 is in a superconducting state, initially. Next, input current Ii is supplied from an input terminal 2 to the input line 101 of the magnetic flux coupled-type superconducting device so that magnetic flux produced by the input current Ii switches the state from the superconducting state to a voltage state. In this voltage state, bias current Ics supplied with the variable current source 102 flows through the load resistor 103. The switching operation of the Josephson device as explained above has been disclosed for example in "Josephson-Logic Device and Circuit" by T. R. Gheewala, IEEE Trans. Electron Devices, Vol. ED-27, no. 10, pp. 1857–1869. In the prior art technologies as provided in the above treatise, the bias current Ics supplied to the Josephson device is fixed and the circuit configuration is not changed during operation. On the other hand, according to this invention, the bias current is variable and controllable from the outside. In other words, depending on outer circumstances; circuit parameters are changed to substantially vary the circuit configuration. This process itself corresponds to the learning process explained above. In the circuit shown in FIG. 3, to this end, a variable current source 102 can be used to change the bias current Ics. The variable current source 102 is controlled via a bias control terminal 3 and a bias control line 5. In this configuration, when the digital input signal Xi is "0", output current Iout flowing through the load resistor 103 is zero. When the digital input signal Xi is "1", the bias current flows through the load resistor 103 as the output current Iout. Therefore, the output current Iout flowing through the load resistor 103 is represented by the following equation (1).

$$Iout = Ics \times Xi, \quad Xi = (1, 0) \tag{1}$$

It is clear from the equation (1) that to change the bias current Ics is to change the weight in the threshold bias circuit. Therefore, the circuit shown in FIG. 3 itself has a new capability, that is, learning.

Figure 4:
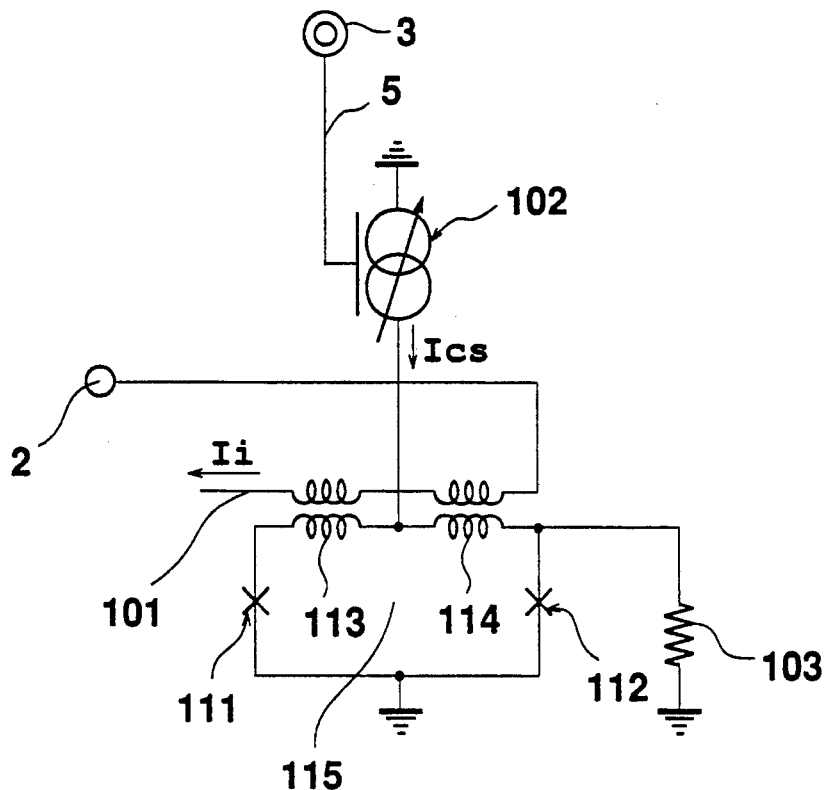
FIG. 4 is a circuit diagram of means for supplying bias current to a 2 junction quantum interference device.

FIG. 4 shows an example of a circuit which employing a magnetic flux coupled-type Josephson element 110. This example is a Josephson device by the name of 2 junction quantum interference circuit which has been disclosed in the above treatise by Gheewala. This 2 junction quantum interference circuit comprises a superconducting closed circuit having two Josephson junctions 111 and 112 and two inductors 113 and 114. The Josephson junctions 111 and 112 are in a superconducting state at the beginning of operation and the bias current Ics flows through the Josephson junctions 111 and 112 to the ground. An input line 101 is inductively connected to the inductors 113 and 114, so that magnetic flux produced by input line Ii flowing through the input current passes through the superconducting closed circuit 115. Therefore, when the input current Ii is supplied, the states of the Josephson junctions are switched from a superconducting state to a voltage state. At this time, the bias current Ics flows to the ground through the load resistor 103. Precisely, the bias current Ics is inversely proportional to the resistivity of the load resistor 103 when the Josephson junctions are at the voltage state. In the prior art Josephson device circuit technologies, in order to enlarge an output current through the load resistor 103 and to equalize the output currents of many devices, it is needed that the critical currents of the Josephson junctions are made equal and the resistivities of the Josephson junctions at the voltage state are enlarged and equalized. These propositions are incompatible with those of the device manufacturing technologies, thus high level process control technologies are required. On the contrary, in the threshold logic circuits according to this invention, since an optimum bias current is selected by learning, the level of device manufacturing technologies required in this invention is not so high as that required in the prior art Josephson circuits. In other words, even if a few of many Josephson devices fail, it is possible to attain a predetermined purpose in a whole circuit.

Figure 1:
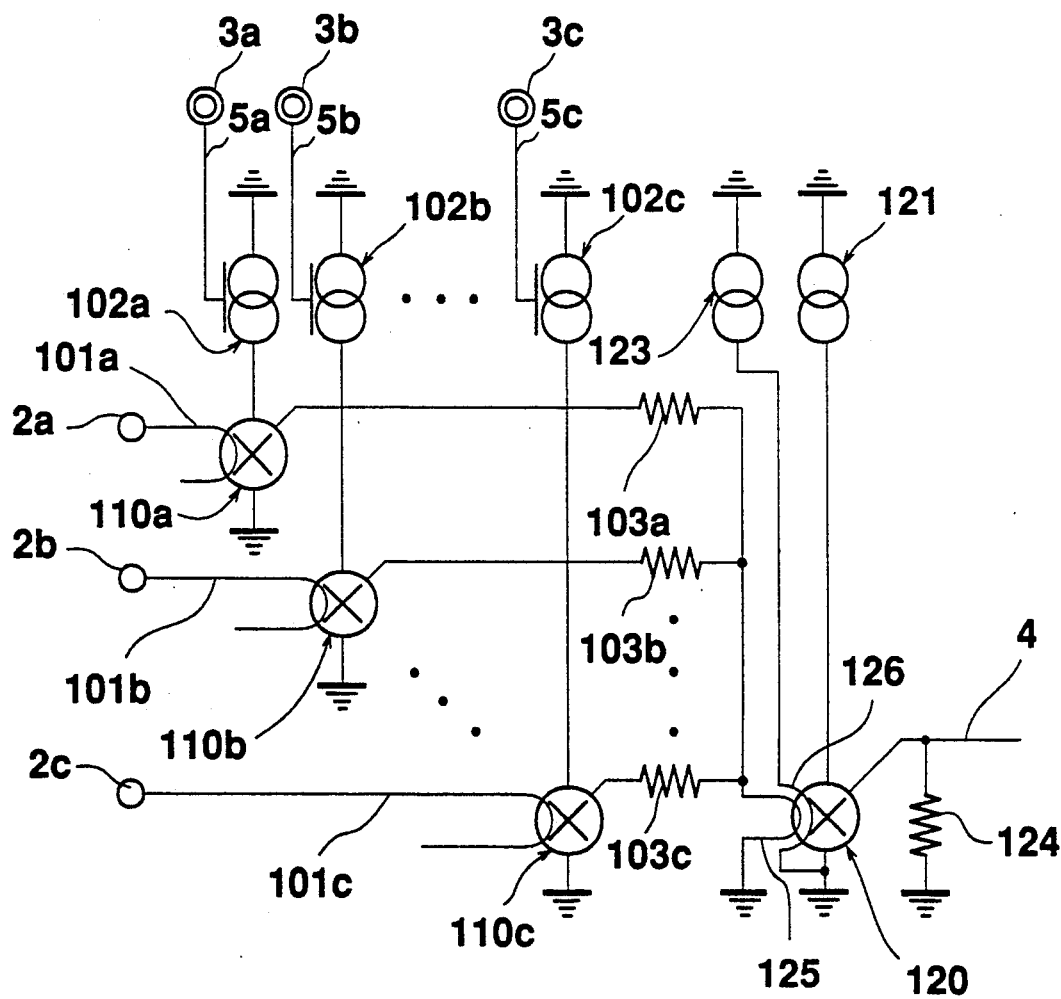
FIG. 1 is a circuit diagram of a first example of a threshold logic circuit according to this invention.
Figure 2:
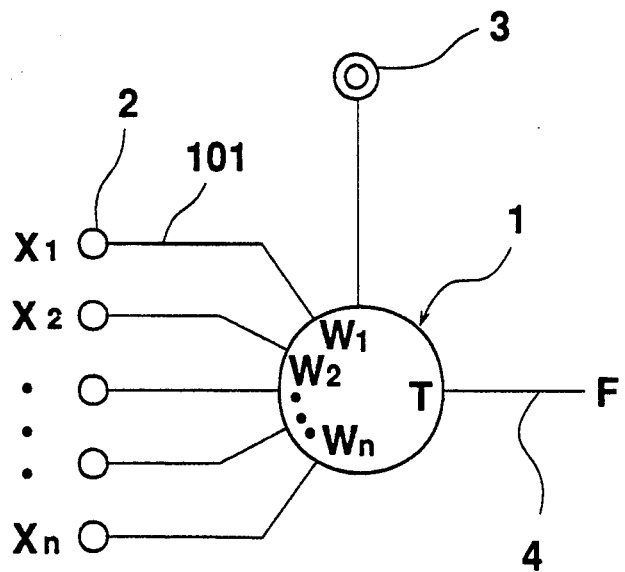
FIG. 2 illustrates operation of a threshold logic circuit.

FIG. 1 is a first example of the superconducting threshold logic circuit according to this invention. In the example shown in FIG. 1, a plurality of the circuits shown in FIG. 3 are prepared. Output currents flowing through a plurality of load resistors 103a, 103b and 103c of the circuits flow to the ground commonly through a control line 125. The control line 125 is to control another magnetic flux coupled-type Josephson device 120. A load resistor 124 is connected to the magnetic flux coupled-type Josephson device 120. Bias current supplied by a current source 121 flows to the ground through the Josephson device 120 when the magnetic flux coupled-type Josephson device is in a superconducting state or through the load resistor 124 when it is in a voltage state. The magnetic flux coupled-type Josephson device 120 is provided with another control line 126 which is supplied with control current from a current supply source 123. In the configuration of FIG. 1, input signals Xi are inputted to the input terminals 2a, 2b and 2c of a plurality of the circuits shown in FIG. 3. variable current sources 102a, 102b and 102c are controlled by bias control terminals 3a, 3b and 3c through bias control line 5a, 5b and 5c, respectively so that bias currents applied to the respective Josephson devices 110a, 110b and 110c are changed to vary weights for the corresponding input signals. A sum of weighted input signals flows through the control line 125 and switches the state of the magnetic flux coupled-type Josephson device from a superconducting state to a voltage state. Since the control current for switching the state can be compensated by current through the control line 126, the threshold T shown in FIG. 2 can be changed. From the above descriptions, it will be clear that the example of FIG. 2 carries out the operation of the threshold circuit shown in FIG. 2. Although in the above descriptions the 2 junction quatum interference circuit is used as an example of the magnetic flux coupled-type Josephson device, it will be appreciated that this invention can be realized by employing a quantum interference circuit having more than two junctions. And further, while in the above description the magnetic flux coupled type Josephson devices are used as the Josephson devices, this invention can be also implemented by using direct coupled-type Josephson devices. In the direct coupled-type Josephson devices, input current is directly injected to the Josephson devices to switch the state of the device from a superconducting state to a voltage state. This direct coupled type Josephson device has been disclosed in the treatise by Gheewala.

Figure 5:
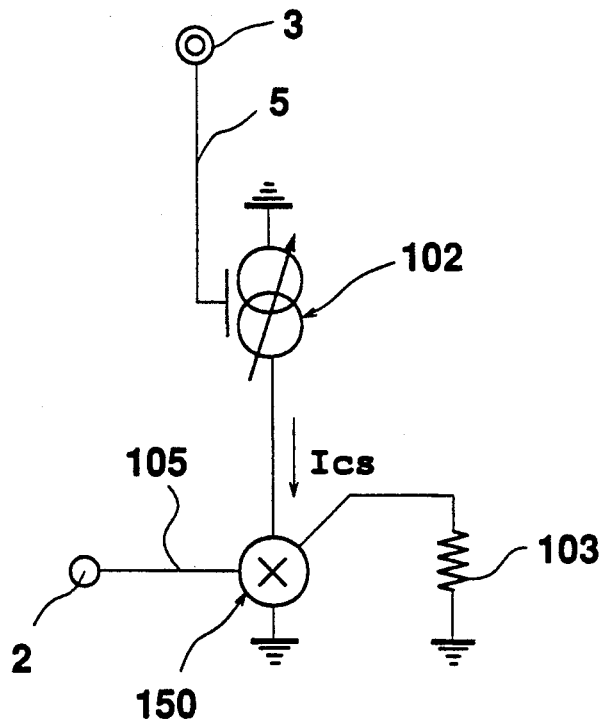
FIG. 5 is circuit diagram of means for supplying bias current to a direct coupled-type Josephson device used in this invention.

FIG. 5 shows means for supplying bias current to the Josephson device used in the superconducting threshold circuit when the direct coupled-type Josephson device 150 is employed. An input current is directly injected to the direct coupled-type Josephson device 150 through an input line 105. Operation of this circuit is the same as that of the circuit shown in FIG. 3 except that the input current is directly injected to the Josephson device.

Figure 6:
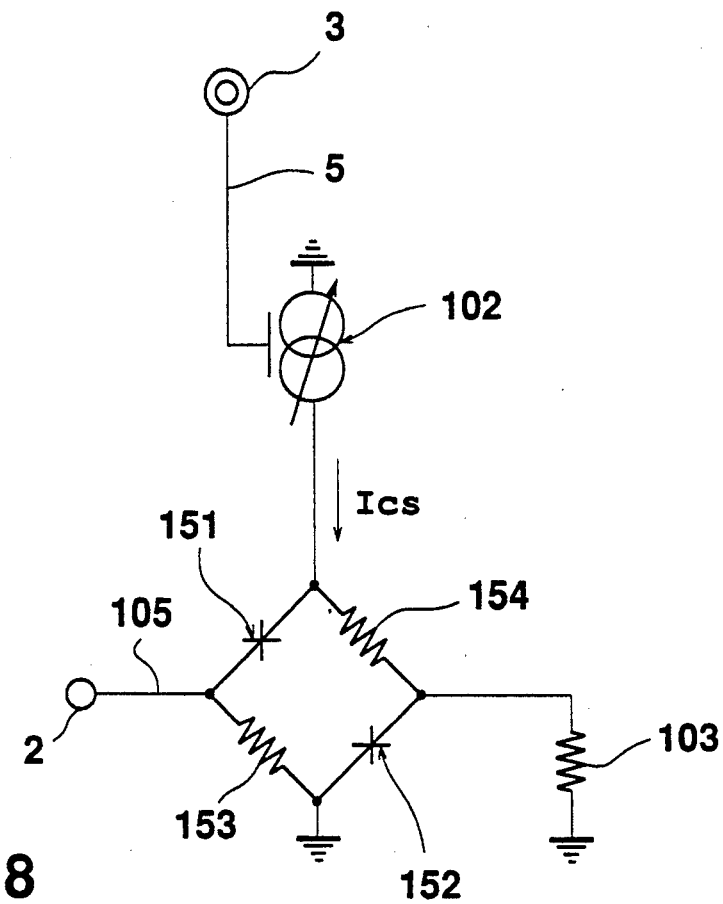
FIG. 6 is a circuit diagram of means for supplying bias current by use of the DCL.

FIG. 6 is an example where DCL(Direct Coupled Logic) circuit is used as the direct coupled-type Josephson device. The DCL circuit comprises two Josephson junctions 151 and 152 and resistors 153 and 154 which form a closed loop. In an initial state of operation, the Josephson junctions are a superconducting state. When the input current is injected, the Josephson devices 151 and 152 turn to a voltage state so as to switch the flowing of the bias current Ics to the path of a load resistor 103. This DCL circuit is also disclosed in the treatise by Gheewala. It will be obvious that this capability can be realized by using another direct coupled type Josephson device other than the DCL circuit.

Figure 7:
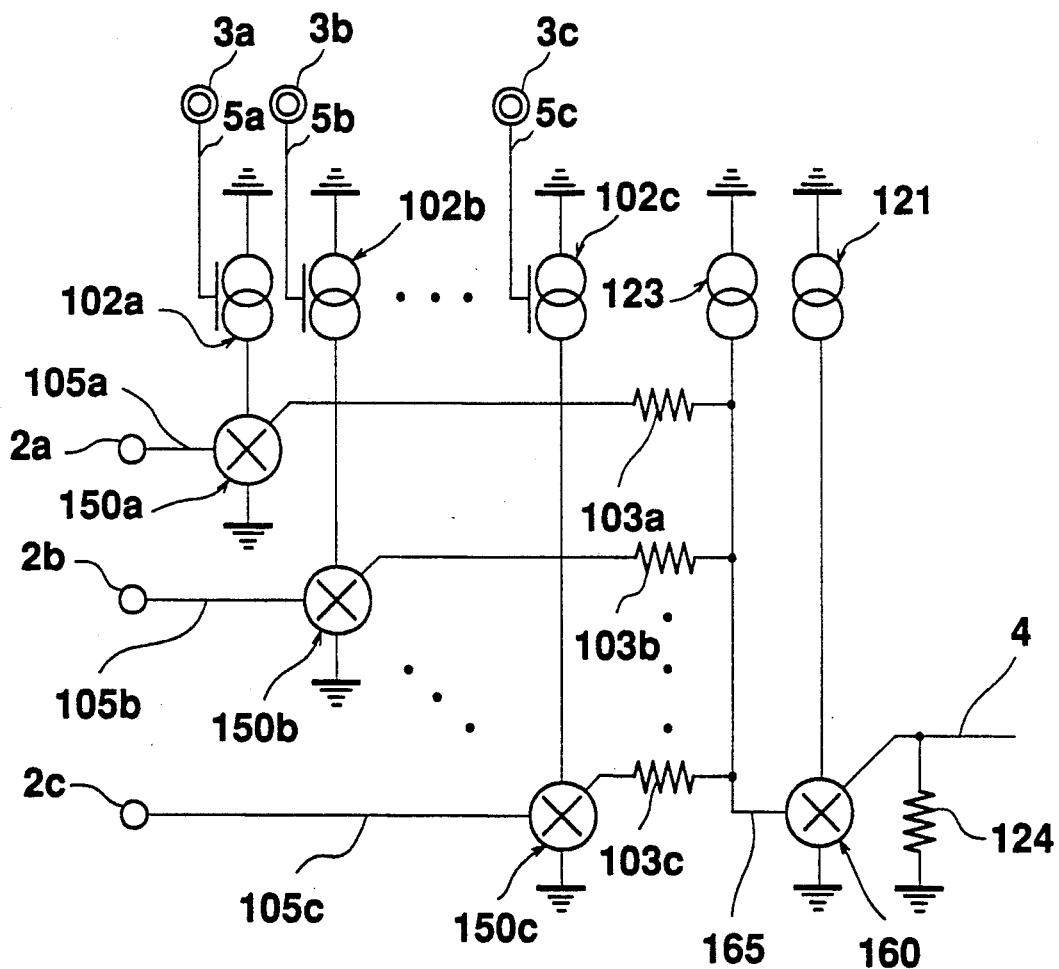
FIG. 7 is a circuit diagram of a second example of a superconducting threshold circuit according to this invention.

FIG. 7 is a second example according to this invention. In this example, the direct coupled-type Josephson device shown in FIG. 5 is used. A plurality of the Josephson devices 150a, 150b and 150c having input terminals 105a, 105b and 105c are prepared. A sum of currents through load resistors 103a, 103b and 103c is injected to the another direct current coupled-type Josephson device through an input line 165. In order to vary the threshold value of the direct coupled-type Josephson device 160, a control current from a current source 123 is directly injected to the direct coupled-type Josephson device. From these descriptions, it will be clear that the example shown in FIG. 7 has the same capability as the circuit shown in FIG. 1 has.

Figure 8:
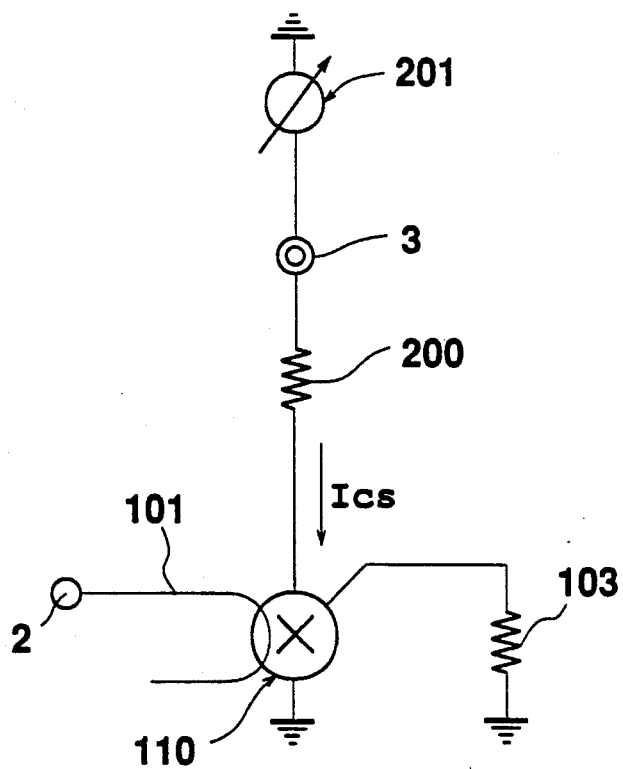
FIG. 8 is a circuit diagram of a first configuration of a variable current source.

FIG. 8 shows a first example of means for controlling the bias current according to this invention. In this example, the variable current source comprises a resistor 200. The bias current terminal is connected to a variable current source 201. In this circuit configuration, by changing the output voltage of the variable current source, the bias current Ics supplied to the Josephson device can be changed by learning. Also, it is possible to represent excitation and sedation signals in a neural network by using two-types of the variable current sources 201, the output voltages of which have distinct polarities, that is, negative and positive. FIG. 8 shows means for controlling the bias current in an analog way.

Figure 9:
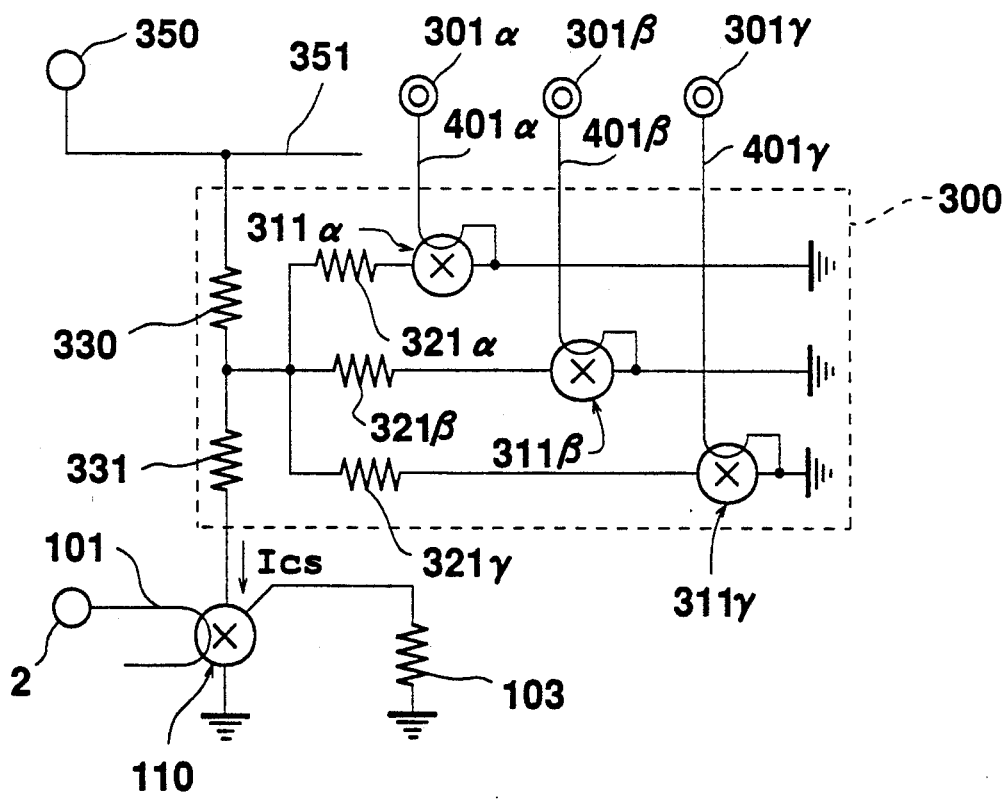
FIG. 9 is a second diagram of a second configuration of a variable current source.

FIG. 9 shows an example of means for controlling the bias current in a digital way. In the, example shown in FIG. 9, the variable current source 102 comprises a current dividing network 300 and source line 351. The source line 351 is supplied with power through a terminal 351. In the current dividing network 300, the source line 351 and the Josephson device 110 are connected by a serial connection of a first resistor 330 and a second resistor 331. The connection point between the first and the second resistors 330 and 331 is connected in parallel with a plurality of current switching circuits each comprising a resistor 321α, 321β or 321γ and a Josephson device 311α, 311β or 311γ. The Josephson devices 311α, 311β and 311γ are supplied with bias control signals as digital signals through bias control terminals 301α, 301β and 301γ; and bias control lines 401α, 401β and 401γ. In this circuit configuration, the Josephson device 311 is controlled by the bias control signal to be switched to a superconducting state or a voltage state. Therefore, a total sum of currents flowing through the circuits connected in parallel is varied with a combination of the bias control signals. On the other hand, bias current Ics flowing through the Josephson device 110 is a difference between the current through resistor 330 and the sum of the currents flowing through the parallel circuits. Thus, in the circuit shown in FIG. 9, the bias current Isc of the Josephson device 110 can be controlled by digital signals as the bias control signals inputted to the bias control terminals 301α, 301β and 301β.

Figure 10:
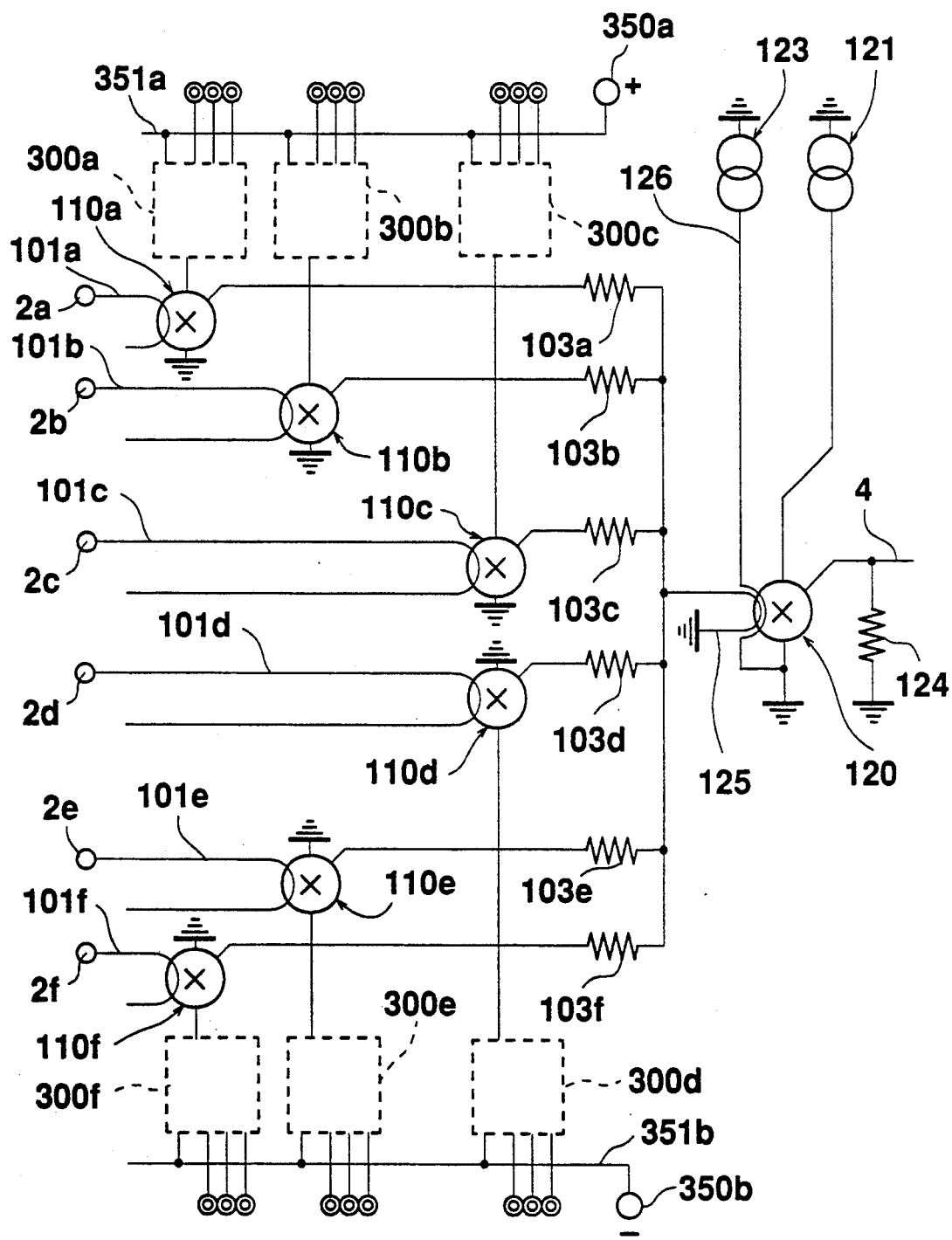
FIG. 10 is a circuit diagram of a third example of a superconducting threshold circuit according to this invention.

FIG. 10 is another example of the threshold logic circuit using the circuit shown in FIG. 9. In this circuit configuration, a plurality of circuits shown in FIG. 9 are prepared (wherein a small letter a, . . . , f is attached to each reference numeral to distinguish the circuits), voltages applied to the current dividing networks 300a, . . . , 300d are separated into two groups, that is, a positive voltage and a negative voltages which are supplied to the terminals 350a and 350b, respectively. From this configuration, the threshold logic circuit of FIG. 1 can be constructed and the positive and the negative distinct signals are used to represent excitement and sedation signals in a neural network.

Although in the above descriptions the magnetic flux coupled-type Josephson device and the direct coupled-type Josephson device are separately used to explain the examples, the magnetic flux coupled-type Josephson device and the direct coupled-type Josephson device can be mixed to implement this invention.

As described above, according to this invention, a threshold logic circuit having learning capability can be configurated by use of high speed switching circuits. As a result, a high speed computer adequate for the recognizing process using this threshold logic circuits are implemented. Therefore, this invention is indispensable for establishing a high speed computer which carries out a high level recognizing process.

What is claimed is:

1. A superconducting threshold logic circuit comprising:
    a plurality of first current switching circuits each having
    a first Josephson device having at least one Josephson junction which causes transition between a superconduction state and a voltage state by applying an input signal,
    a variable bias current supply means for supplying bias current to the Josephson device, and
    a load resistor through which all or part of the bias current applied to the Josephson device flows during the voltage state; and a second current switching circuit having a second Josephson device for receiving a sum of currents flowing through the load resistors of the first current switching circuits, whereby the bias currents of said first current switching circuits are controlled independently to change weights for the input signals and said second current switching circuit determines whether the sum of currents is greater than a threshold value of the second Josephson device.

2. A superconducting threshold logic circuit as claimed in claim 1 further comprising means for changing the threshold value of said second Josephson device.

3. A superconducting threshold logic circuit as claimed in claim 1 wherein said variable bias current supply means comprises a serial connection of a resistor and a variable voltage source.

4. A superconducting threshold logic circuit as claimed in claim 1 wherein said variable bias current supply means comprises a constant current source and a current dividing network connected between the constant current source and said first Josephson device of the first current switching circuit.

5. A superconducting threshold logic circuit as claimed in claim 4 wherein said current dividing network has a configuration of a parallel connection of a plurality of serial connections of third Josephson devices and resistors, and means for controlling switching of the state of the third Josephson device between a superconducting state and a voltage state is further provided.

6. A superconducting threshold logic circuit as claimed in claim 1 wherein bias currents to said first Josephson devices flow in opposite directions to represent excitement and sedation signals in a neural network.

* * * * *